United States Patent
Kuo et al.

(10) Patent No.: US 9,236,562 B2
(45) Date of Patent: Jan. 12, 2016

(54) BALANCING ENERGY BARRIER BETWEEN STATES IN PERPENDICULAR MAGNETIC TUNNEL JUNCTIONS

(75) Inventors: Charles C. Kuo, Hillsboro, OR (US); Brian S. Doyle, Portland, OR (US); Arijit Raychowdhury, Hillsboro, OR (US); Roksana Golizadeh Mojarad, San Jose, CA (US); Kaan Oguz, Dublin (IE)

(73) Assignee: INTEL CORPORATION, Santa Clara, CA (US)

( * ) Notice: Subject to any disclaimer, the term of this patent is extended or adjusted under 35 U.S.C. 154(b) by 242 days.

(21) Appl. No.: 13/997,394

(22) PCT Filed: Dec. 30, 2011

(86) PCT No.: PCT/US2011/068158
§ 371 (c)(1),
(2), (4) Date: Jun. 24, 2013

(87) PCT Pub. No.: WO2013/101203
PCT Pub. Date: Jul. 4, 2013

(65) Prior Publication Data
US 2014/0117476 A1    May 1, 2014

(51) Int. Cl.
*G11C 11/00* (2006.01)
*H01L 43/12* (2006.01)
(Continued)

(52) U.S. Cl.
CPC .............. *H01L 43/12* (2013.01); *G11C 11/161* (2013.01); *G11C 11/1675* (2013.01); *H01L 43/02* (2013.01); *H01L 43/08* (2013.01); *G11C 11/1673* (2013.01)

(58) Field of Classification Search
CPC ....................................................... G11C 11/00

USPC ......... 365/48, 55, 62, 66, 74, 78, 80–93, 100, 365/130, 131, 148, 158, 171–173, 209, 213, 365/225.5, 230.07, 232, 243.5; 257/421, 257/E21.665; 438/3; 977/933–935
See application file for complete search history.

(56) References Cited

U.S. PATENT DOCUMENTS 7,940,600 B2    5/2011    Dimitrov et al.
8,054,677 B2    11/2011    Zhu
(Continued)

FOREIGN PATENT DOCUMENTS

WO    2013/101203 A1    7/2013

OTHER PUBLICATIONS

International Search Report and Written Opinion received for PCT Patent Application No. PCT/US2011/068158, mailed on Jul. 18, 2012, 11 Pages.
(Continued)

*Primary Examiner* — Harry W Byrne
(74) *Attorney, Agent, or Firm* — Finch & Maloney PLLC (57) ABSTRACT

Techniques are disclosed for enhancing performance of a perpendicular magnetic tunnel junction (MTJ) by implementing an additional ferromagnetic layer therein. The additional ferromagnetic layer can be implemented, for example, in or otherwise proximate either the fixed ferromagnetic layer or the free ferromagnetic layer of the perpendicular MTJ. In some embodiments, the additional ferromagnetic layer is implemented with a non-magnetic spacer, wherein the thickness of the additional ferromagnetic layer and/or spacer can be adjusted to sufficiently balance the energy barrier between parallel and anti-parallel states of the perpendicular MTJ. In some embodiments, the additional ferromagnetic layer is configured such that its magnetization is opposite that of the fixed ferromagnetic layer.

11 Claims, 5 Drawing Sheets

(51) Int. Cl.
*H01L 43/08* (2006.01)
*G11C 11/16* (2006.01)
*H01L 43/02* (2006.01)

(56) References Cited

U.S. PATENT DOCUMENTS

| | | | |
|---|---|---|---|
| 8,063,460 B2 | 11/2011 | Nikonov et al. | |
| 2004/0257718 A1* | 12/2004 | Nickel | B82Y 10/00 |
| 2006/0018057 A1* | 1/2006 | Huai | G01R 33/06 360/324.2 |
| 2010/0109110 A1 | 5/2010 | Wang et al. | 360/324.2 |

OTHER PUBLICATIONS

International Preliminary Report on Patentability for Application No. PCT/US2011/068158, mailed on Jul. 10, 2014, 7 pages.

* cited by examiner

BALANCING ENERGY BARRIER BETWEEN STATES IN PERPENDICULAR MAGNETIC TUNNEL JUNCTIONS

BACKGROUND

Integrated circuit design in the deep-submicron process nodes (e.g., 32 nm and beyond) involves a number of non-trivial challenges, and circuits incorporating microelectronic components such as transistors or memory devices have faced particular complications at these levels, such as those with respect to achieving small device features with optimal device parameters and circuit performance. Continued process scaling will tend to exacerbate such problems.

DETAILED DESCRIPTION

Techniques are disclosed for enhancing performance of a perpendicular magnetic tunnel junction (MTJ) by implementing an additional ferromagnetic layer therein. The additional ferromagnetic layer can be implemented, for example, in or otherwise proximate either the fixed ferromagnetic layer or the free ferromagnetic layer of the perpendicular MTJ. In some embodiments, the additional ferromagnetic layer is implemented with a non-magnetic spacer, wherein the thickness of the additional ferromagnetic layer and/or spacer can be adjusted to sufficiently balance the energy barrier between parallel and anti-parallel states of the perpendicular MTJ. In some embodiments, the additional ferromagnetic layer is configured such that its magnetization is opposite that of the fixed ferromagnetic layer. The additional ferromagnetic layer can be used, for instance, to mitigate/eliminate the intrinsic offset of energies between the parallel and anti-parallel states of the perpendicular MTJ, thereby better centering the resistance-external magnetic field hysteresis, balancing the energy barrier between states, and/or otherwise improving performance of the perpendicular MTJ. The techniques may be implemented, for example, in memory devices, sensors, disk-drive read-heads, and/or other circuitry that can benefit from the binary nature of a MTJ device.

General Overview

A magnetic tunnel junction (MTJ) device is a magnetoresistive device whose resistance is programmable and can be set to either a high resistivity or low resistivity state in response to an applied magnetic field. The difference in resistance between these two states is generally referred to as the magnetoresistance (MR) ratio, which can range for instance from less than 10% to several hundred percent or more, depending on the temperature and materials from which the device is made. A typical MTJ device configuration includes an insulator layer of tunneling oxide sandwiched between two ferromagnetic layers respectively referred to as the fixed and free layers. The direction of the magnetic field in the free layer determines whether the MTJ device is in the high resistivity state or in the low resistivity state. A binary zero can be stored in the MTJ device by changing its resistance to the low resistivity state, and a binary one can be stored by changing its resistance to the high resistivity state. Advantageously, no static power is required to maintain the resistance state once set. If the insulator layer is sufficiently thin, electrons may pass from one ferromagnetic layer to the other via quantum tunneling through the insulator layer.

The two ferromagnetic layers of a given MTJ typically exhibit magnetic anisotropy—a directional dependence of their magnetic properties. The magnetic anisotropy of a given ferromagnetic layer may result from various sources including, but not limited to: (1) bulk-based anisotropy (e.g., magnetocrystalline anisotropy; shape anisotropy); and/or (2) interface-based anisotropy. Depending upon the direction of magnetization of its constituent ferromagnetic layers, a given MTJ may be classified as exhibiting either: (1) in-plane magnetic anisotropy; or (2) out-of-plane magnetic anisotropy. An in-plane MTJ is one in which the direction of magnetization is along the plane of the two ferromagnetic layers. Conversely, an out-of-plane (perpendicular) MTJ is one in which the direction of magnetization is orthogonal to the plane of the constituent ferromagnetic layers. The two ferromagnetic layers may be configured such that their respective magnetizations are aligned either in the same direction—the parallel (P) state—or in opposing directions—the anti-parallel (AP) state.

Figure 1A:
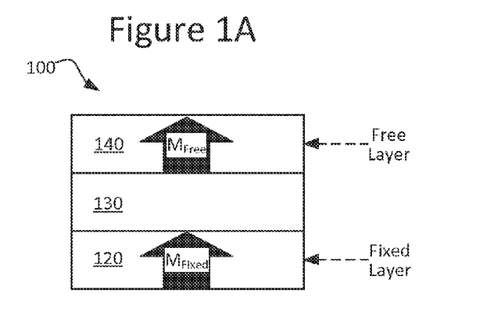
FIG. 1A is a cross-section, schematic view of a conventional perpendicular magnetic tunnel junction (MTJ) in its parallel state.
Figure 1B:
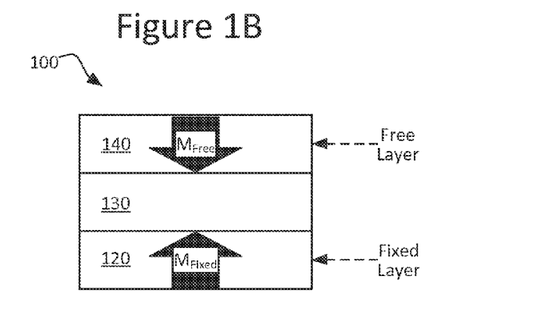
FIG. 1B is a cross-section, schematic view of the conventional perpendicular MTJ of FIG. 1A in its anti-parallel state.

FIG. 1A is a cross-section, schematic view of a conventional perpendicular MTJ 100 in its parallel (P) state. FIG. 1B is a cross-section, schematic view of the perpendicular MTJ 100 of FIG. 1A in its anti-parallel (AP) state. As can be seen, perpendicular MTJ 100 is a layered structure including a first (fixed) ferromagnetic layer 120, an insulator layer 130, and a second (free) ferromagnetic layer 140, stacked as shown. The fixed layer, sometimes referred to as being pinned, does not normally undergo changes in its magnetization ($M_{Fixed}$)—its direction of magnetization remains fixed and serves as a reference. On the other hand, the free layer, sometimes referred to as being dynamic, does undergo changes in the direction of its magnetization ($M_{Free}$).

In FIG. 1A, fixed ferromagnetic layer 120 and free ferromagnetic layer 140 have magnetizations—$M_{Fixed}$ and $M_{Free}$, respectively—in the same direction (perpendicular MTJ 100 is in its P state). In the P state, electrons with spins oriented parallel to the magnetization (spin-up electrons) readily pass from the fixed ferromagnetic layer 120 through the insulator layer 130 to the free ferromagnetic layer 140, while electrons with spins oriented anti-parallel to the magnetization (spin-down electrons) are strongly scattered. The spin-up electrons can tunnel through the insulator barrier 130 because there is a sufficiently high quantity of unoccupied spin-up states available in the free ferromagnetic layer 140. As a result, P-state MTJ 100 has a low resistivity for electrons with spins oriented parallel to the magnetization and a high resistivity for electrons with spins oriented anti-parallel to the magnetization. Otherwise put, it is more likely that electrons will tunnel (a current will pass) through the insulating layer 130 in the P state (low resistance state) of perpendicular MTJ 100 than in the AP state, a discussion of which now follows.

In FIG. 1B, $M_{Fixed}$ and $M_{Free}$ are in opposing directions (perpendicular MTJ 100 is in its AP state). In the AP state, electrons of both types of spins (spin-up and spin-down electrons) are strongly scattered. Quantum tunneling is suppressed in this instance because there are fewer spin-up states available (as compared to the P state previously discussed with reference to FIG. 1A). As a result, AP-state MTJ 100 has a high resistivity for electrons regardless of spin orientation. Otherwise put, it is less likely that electrons will tunnel (a current will pass) through the insulating layer 130 in the AP state (high resistance state) of perpendicular MTJ 100 than in the P state.

Figure 2A:
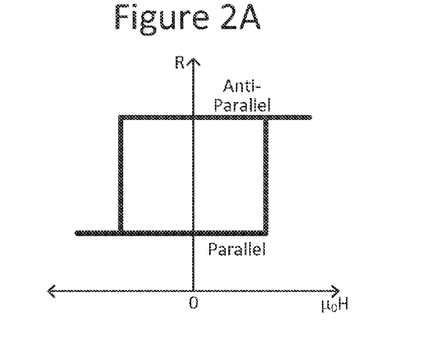
FIG. 2A is a hysteresis diagram illustrating resistance as a function of external magnetic field for an idealized perpendicular MTJ.

As previously noted, a given perpendicular MTJ may be designed such that the magnetization $M_{Free}$ (e.g., direction of magnetization) of its free ferromagnetic layer may be changed (e.g., flipped). In the context of flipping $M_{Free}$, a perpendicular MTJ ideally would behave as variously depicted in FIGS. 2A and 2B. FIG. 2A is a hysteresis diagram illustrating resistance (R) as a function of external magnetic field ($\mu_0 H$) for an idealized perpendicular MTJ. As can be seen, the R-H hysteresis is well-centered at zero for the idealized perpendicular MTJ. Thus, as will be appreciated, the strength of the external magnetic field necessary to flip the magnetization $M_{Free}$ of the free ferromagnetic layer and thus switch the idealized perpendicular MTJ from its P to its AP state is of the same magnitude as that required to flip $M_{Free}$ and thus switch from the AP to the P state.

Figure 2B:
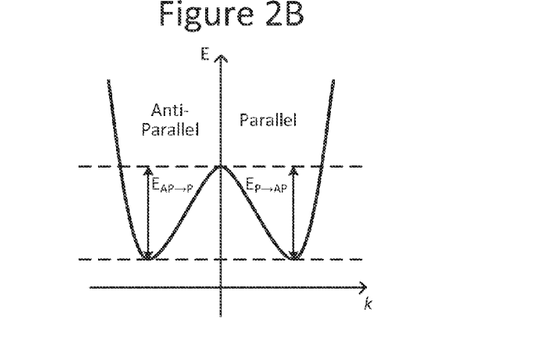
FIG. 2B is an energy diagram for the idealized perpendicular MTJ of FIG. 2A.

FIG. 2B is an energy diagram for the idealized perpendicular MTJ of FIG. 2A. As can be seen, the respective energies of the P state and of the AP state of the idealized perpendicular MTJ are equivalent, and thus neither state is energetically more favorable (e.g., of a lower energy) than the other. Accordingly, the energy barrier between the P and AP states of the idealized perpendicular MTJ is such that switching from AP to P and from P to AP is achieved with the same relative energy requirements. For instance, if the idealized perpendicular MTJ were implemented, for example, in a magnetoresistive memory device (e.g., magnetoresistive random access memory, MRAM), the minimum energy barrier required to ensure non-volatility of the memory device while switching from the AP to the P state (and similarly from the P to the AP state) would be about 60 kT (e.g., symmetrical energy requirements). Other example energy barrier values will depend on a given application, and the example context of a magnetoresistive memory device is intended for illustrative purposes only and not as a limitation on the claimed invention.

Figure 2C:
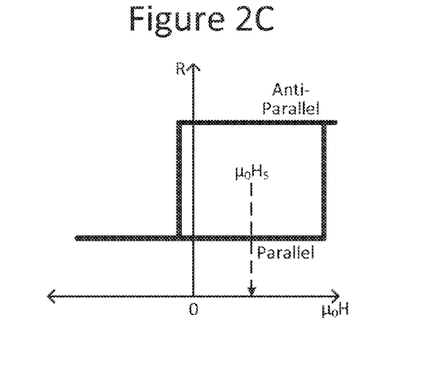
FIG. 2C is a hysteresis diagram illustrating resistance as a function of external magnetic field for the conventional perpendicular MTJ of FIGS. 1A-1B.

However, real-world limitations/constraints inhibit/preclude conventional MTJ designs from achieving the idealization depicted in FIGS. 2A-2B. Instead, conventional MTJ designs (e.g., such as that of FIGS. 1A-1B) are associated with a number of non-trivial issues. For instance, perpendicular MTJs have an intrinsic offset in energy barrier between their P and AP states, as variously depicted in FIGS. 2C and 2D, which inhibits/precludes the idealized performance variously depicted in FIGS. 2A-2B. In more detail, FIG. 2C is a hysteresis diagram illustrating resistance (R) as a function of external magnetic field ($\mu_0 H$) for the conventional perpendicular MTJ 100 of FIGS. 1A-1B. As can be seen, as compared to the idealization represented by FIG. 2A, here the R-H hysteresis is centered on a non-zero value (e.g., $\mu_0 H_S$). Therefore, as will be appreciated, the strength of the external magnetic field necessary to flip the magnetization $M_{Free}$ of the free ferromagnetic layer 140 and thus switch the perpendicular MTJ 100 from its P state to its AP state is of substantially greater magnitude than that required to flip $M_{Free}$ and thus switch the perpendicular MTJ 100 from its AP state to its P state. Accordingly, substantially more energy must be expended (via a stronger applied external magnetic field) to switch a conventional perpendicular MTJ 100 from its low resistance state (P state) to its high resistance state (AP state) than to switch MTJ 100 from its high resistance state (AP state) to its low resistance state (P state).

Figure 2D:
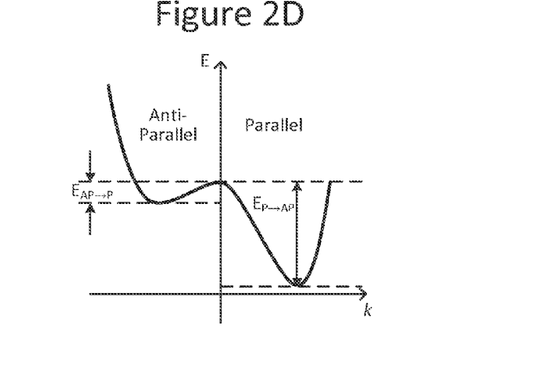
FIG. 2D is an energy diagram for the conventional perpendicular MTJ of FIGS. 1A-1B.

FIG. 2D is an energy diagram for the conventional perpendicular MTJ 100 of FIGS. 1A-1B. As can be seen, the relative energy of the P state of perpendicular MTJ 100 is lower (e.g., energetically more favorable) than its AP state. Accordingly, the energy barrier between the P and AP states of the perpendicular MTJ 100 is such that switching from AP to P is achieved with substantially different (e.g., lesser) energy requirements as compared to switching from P to AP. For instance, if the perpendicular MTJ 100 were implemented, for example, in a magnetoresistive memory device (e.g., magnetoresistive random-access memory, MRAM), the minimum energy barrier required to ensure non-volatility while switching from the AP to the P state would remain about 60 kT (as it was with the idealized MTJ discussed above with reference to FIGS. 2A-2B). However, as a result of the asymmetrical energy barrier intrinsic to conventional perpendicular MTJ 100, switching from the P to the AP state would require a substantially larger amount of energy (e.g., four or more times the minimum energy required for AP-to-P switching). Consequently, perpendicular MTJ 100 is predisposed to achieving and remaining in the P state (lower resistance and lower, more stable energy state). Thus, as will be appreciated, the total energy required for switching between P and AP states in a conventional MTJ 100 is substantially higher than that required for the more efficient switching of the idealized perpendicular MTJ.

One approach that can be used in effort to resolve the intrinsic offset in energy barrier of a conventional perpendicular MTJ 100 involves changing the relative area of the free ferromagnetic layer 140 versus that of the fixed ferromagnetic layer 120. However, such an approach introduces patterning complexity, thereby possibly increasing production errors and fabrication costs.

Thus, and in accordance with an embodiment of the present invention, the performance of a perpendicular magnetic tunnel junction (MTJ) may be improved by inclusion of an additional ferromagnetic layer in the design thereof. The additional ferromagnetic layer may be included, for example, in or otherwise proximate either the fixed layer or the free layer of the perpendicular MTJ. In some such embodiments, the additional ferromagnetic layer may be implemented with a non-magnetic spacer disposed between it and the proximate ferromagnetic layer (free layer or fixed layer). In one or more embodiments, the additional ferromagnetic layer introduces an internal magnetic field that compensates for, in part or in whole, the intrinsically asymmetric energy barrier between the P and AP states of the perpendicular MTJ, thereby mitigating and/or otherwise reducing the intrinsic energy offset. In some example instances, the magnetic field produced by the additional ferromagnetic layer within the MTJ helps to: (1) better center the R-H hysteresis (e.g., approaching and/or achieving the idealized scenario of FIG. 2A); and/or (2) better balance the energy barrier between P and AP states (e.g., approaching and/or achieving the idealized scenario of FIG. 2B).

In accordance with one or more embodiments of the present invention, techniques disclosed herein may be implemented, for example, in standalone or embedded/on-board memory circuits including, but not limited to non-volatile memories (e.g., magnetoresistive random-access memory, MRAM; spin transfer torque memory, STTM) and volatile memories (e.g., static random-access memory, SRAM; dynamic random-access memory, DRAM). Numerous applications for MTJ devices configured in accordance with an embodiment of the present invention will be apparent in light of this disclosure. In one specific example case, MTJs implemented in accordance with an embodiment of the present invention may be used to achieve small, scalable memory cells. In other embodiments, techniques disclosed herein may be implemented, for example, in disk-drive read-heads. Other suitable applications will be apparent in light of this disclosure, and the claimed invention is not intended to be limited to any particular use.

As will be appreciated in light of this disclosure, there are a number of advantages associated with the various techniques described herein. For instance, in some specific example embodiments, the one or more of the various techniques disclosed herein may be used for: (1) achieving better (e.g., higher) thermal stability as bits scale; (2) mitigating and/or otherwise reducing the intrinsic offset in energy barrier between the P and AP states of a perpendicular MTJ; (3) better centering of the R-H hysteresis of a perpendicular MTJ; (4) more efficient and/or expedient switching between the P and AP states of a perpendicular MTJ; and/or (5) maintaining comparatively simpler device patterning, thus minimizing production errors and fabrication costs. Other benefits will be apparent in light of this disclosure and the claimed invention is not intended to be limited to any particular one.

Inspection of circuitry or other structures/devices using the likes of transmission electron microscopy (to image), magnetic force microscopy and/or photo-emission electron microscopy (for detecting polarization) and a magnetometer (to detect magnetic moment), can be used to show the presence of MTJs configured in accordance with an embodiment of the present invention.

Structure and Operation

In accordance with one or more embodiments of the present invention, an additional ferromagnetic layer (hereinafter, offset layer) may be included in the design of a perpendicular MTJ structure. In some embodiments, the offset layer may be implemented in or otherwise proximate the fixed ferromagnetic layer of the perpendicular MTJ, while in other embodiments the offset layer may be implemented in or otherwise proximate the free ferromagnetic layer of the perpendicular MTJ. In any such embodiments, the offset layer may be implemented with a non-magnetic spacer layer, for example, between it and its proximate ferromagnetic layer (fixed layer or free layer).

Figure 3A:
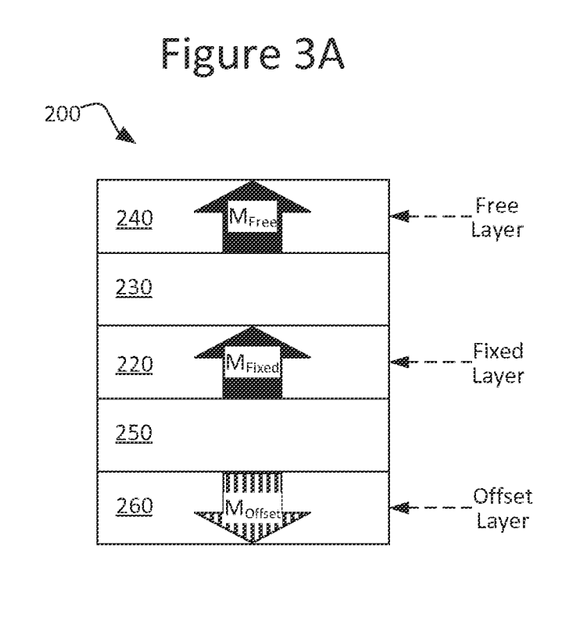
FIG. 3A is a cross-section, schematic view of a perpendicular MTJ in its parallel state, configured in accordance with an embodiment of present invention.
Figure 3B:
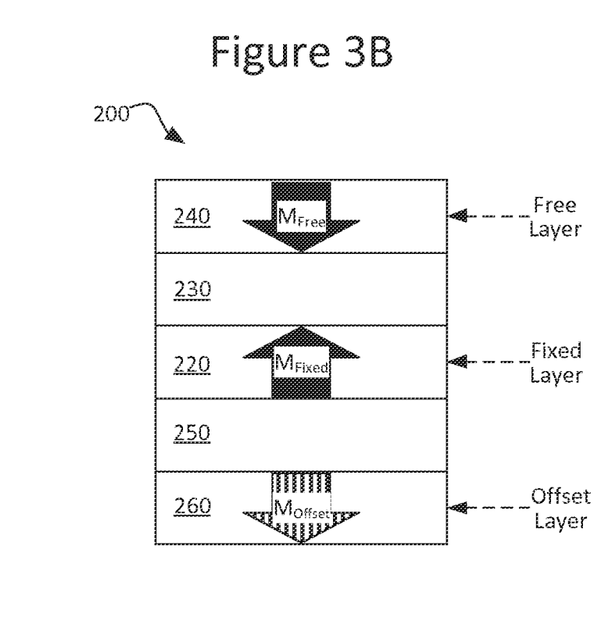
FIG. 3B is a cross-section, schematic view of the perpendicular MTJ of FIG. 3A in its anti-parallel state, configured in accordance with an embodiment of the present invention.

FIG. 3A is a cross-section, schematic view of a perpendicular MTJ 200 in its parallel (P) state, configured in accordance with an embodiment of the present invention. FIG. 3B is a cross-section, schematic view of the perpendicular MTJ 200 of FIG. 3A in its anti-parallel (AP) state, configured in accordance with an embodiment of the present invention. As can be seen in this example configuration, MTJ 200 includes an insulator layer 230 sandwiched between a fixed ferromagnetic layer 220 and a free ferromagnetic layer 240. In addition, MTJ 200 includes a non-magnetic spacer 250 sandwiched between an offset layer 260 and the fixed ferromagnetic layer 220. The magnetization $M_{Offset}$ of the offset layer 260 may be opposite that of the fixed ferromagnetic layer 220, in accordance with an embodiment of the present invention. In both the P state (FIG. 3A) and the AP state (FIG. 3B), offset layer 260 introduces an additional internal magnetic field (via its magnetization $M_{Offset}$) which, in some embodiments, shifts (e.g., better centers) R-H hysteresis, increases the energy of the P state and/or reduces the energy of the AP state (e.g., better equalizes the energy barrier between the P and AP states), and/or otherwise improves performance of the perpendicular MTJ 200. Accordingly, the performance of perpendicular MTJ 200 may approach or otherwise approximate the idealized perpendicular MTJ performance discussed above with reference to FIGS. 2A-2B, in some such embodiments. The magnitude of $M_{Offset}$ may be chosen, adjusted, or otherwise tuned as suitable for a given application, as will be apparent in light of this disclosure.

In any of the various example embodiments illustrated in FIGS. 3A-3B and/or 4A-4B (as discussed below), offset layer 260 may include one or more ferromagnetic materials such as, but not limited to, iron, cobalt, nickel, alloys thereof, transition metal-metalloid alloys (e.g., transition metal with a metalloid such as boron), and/or any other suitable ferromagnetic materials. In some embodiments, offset layer 260 may have one or more dimensions (e.g., surface area; thickness) comparable to those of fixed ferromagnetic layer 220 and/or free ferromagnetic layer 240. In some example embodiments, offset layer 260 may have a thickness, for instance, in the nanometer range (e.g., tens of angstroms to several hundred nanometers), and in one specific example embodiment may be in the range of about 1-100 nm. In some other example embodiments, offset layer 260 may have a thickness in the angstrom range (e.g., about 0.1-1 nm) and/or may be implemented as a monolayer. In some embodiments, offset layer 260 may be implemented, for example, as a thin film deposited by any suitable deposition techniques (e.g., chemical vapor deposition, physical vapor deposition, sputter deposition, molecular beam epitaxy, or other suitable deposition process/means). In still other embodiments, offset layer 260 may be implemented with multiple material layers deposited by any suitable deposition, wherein the multiple layers may be the same material or different materials (ferromagnetic materials, or a combination of ferromagnetic materials and non-ferromagnetic materials). In some embodiments, offset layer 260 may exhibit magnetic anisotropy such that its magnetization may be substantially orthogonal to its surface (e.g., the direction of magnetization $M_{Offset}$ is perpendicular to the plane of the offset layer 260). Other suitable materials, geometries, and/or configurations for offset ferromagnetic layer 260 will be apparent in light of this disclosure, and the claimed invention is not intended to be limited to any particular material, geometry, or configuration.

Furthermore, in any of the various example embodiments illustrated in FIGS. 3A-3B and/or 4A-4B (as discussed below), fixed ferromagnetic layer 220 and/or free ferromagnetic layer 240 may be implemented as conventionally done and may include, for instance, any one or more of the same ferromagnetic materials discussed above with reference to offset layer 260. In some embodiments, fixed ferromagnetic layer 220 and/or free ferromagnetic layer 240 may have one or more dimensions (e.g., surface area; thickness) comparable to those of offset layer 260. In some example embodiments, fixed ferromagnetic layer 220 and/or free ferromagnetic layer 240 may have a thickness, for example, in the nanometer range (e.g., tens of angstroms), and in one specific example embodiment may be in the range of less than or equal to about 1-100 nm. In some other example embodiments, fixed ferromagnetic layer 220 and/or free ferromagnetic layer 240 may have a thickness in the angstrom range (e.g., about 0.1-1 nm) and/or may be implemented as a monolayer. As previously discussed with reference to offset layer 260, fixed ferromagnetic layer 220 and/or free ferromagnetic layer 240 may be implemented, for example, as a thin film deposited by any suitable deposition techniques as previously mentioned. In still other embodiments, fixed ferromagnetic layer 220 and/or free ferromagnetic layer 240 may be implemented with multiple material layers deposited by any suitable deposition, wherein the multiple layers may be the same material or different materials (ferromagnetic materials, or a combination of ferromagnetic materials and non-ferromagnetic materials). In some embodiments, each of fixed ferromagnetic layer 220 and/or free ferromagnetic layer 240 may exhibit magnetic anisotropy such that its magnetization may be substantially orthogonal to its surface (e.g., the direction of magnetization $M_{Fixed}$ and $M_{Free}$ is perpendicular to the plane of the fixed layer 220 and free layer 240, respectively). Other suitable materials, geometries, and/or configurations for fixed ferromagnetic layer 220 and/or free ferromagnetic layer 240 will be apparent in light of this disclosure, and the claimed invention is not intended to be limited to any particular material, geometry, and/or configuration.

Further still, in any of the various example embodiments illustrated in FIGS. 3A-3B and/or 4A-4B (as discussed below), an insulator layer 230 may be included between fixed ferromagnetic layer 220 and free ferromagnetic layer 240 of perpendicular MTJ 200, as conventionally done. The insulator layer 230 may be any suitable dielectric material or materials (e.g., oxides, nitrides, etc.), and in some specific example embodiments is magnesium oxide, aluminum oxide, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, lead scandium tantalum oxide, and lead zinc niobate, and/or other media/material which is non-magnetic and permits sufficient quantum tunneling. Insulator layer 230 may have one or more dimensions (e.g., surface area; thickness) comparable to those of ferromagnetic layers 220, 240, and/or 260. In some instances, one or more dimensions (e.g., thickness) of insulator layer 230 may be chosen/tuned such that fixed layer 220 and free layer 240 are sufficiently insulated from one another while still permitting electrons to pass from one of such ferromagnetic layers to the other via quantum tunneling through the insulator. In some specific instances, insulator layer 230 may have a thickness, for example, in the nanometer range (e.g., tens of angstroms), and in one specific example embodiment may be in the range of less than or equal to about 1-100 nm. In some other example embodiments, insulator layer 230 may have a thickness in the angstrom range (e.g., about 0.1-1 nm) and/or may be implemented as a monolayer. As similarly discussed with reference to ferromagnetic layers 220, 240, and/or 260, in some embodiments, insulator layer 230 may be implemented, for example, as a thin film deposited by any suitable deposition techniques (e.g., chemical vapor deposition, sputter deposition, physical vapor deposition, etc.). In still other embodiments, insulator layer 230 may be implemented with multiple layers deposited by any suitable deposition, wherein the multiple layers may be the same material or different materials (insulator materials, or a combination of insulator materials and non-insulator materials). Other suitable materials, geometries, and/or configurations for insulator layer 230 will be apparent in light of this disclosure, and the claimed invention is not intended to be limited to any particular material, geometry, and/or configuration.

Figure 4A:
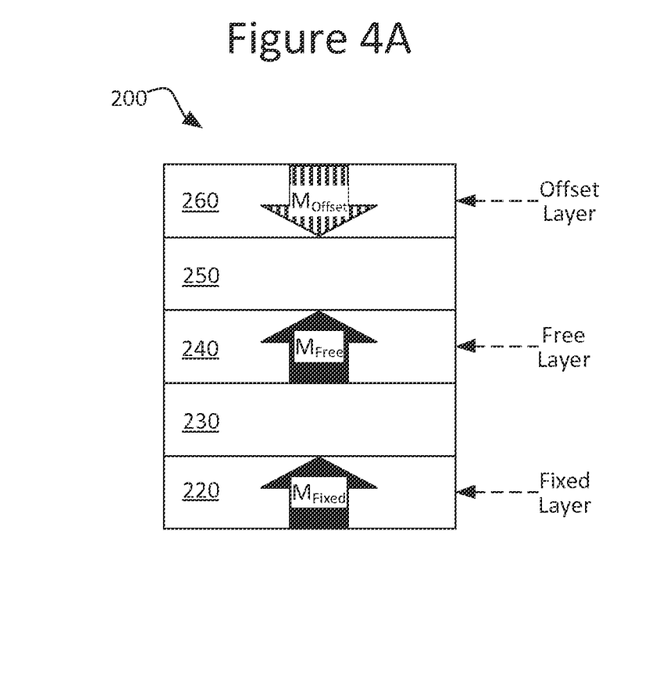
FIG. 4A is a cross-section, schematic view of a perpendicular MTJ in its parallel state, configured in accordance with another embodiment of the present invention.
Figure 4B:
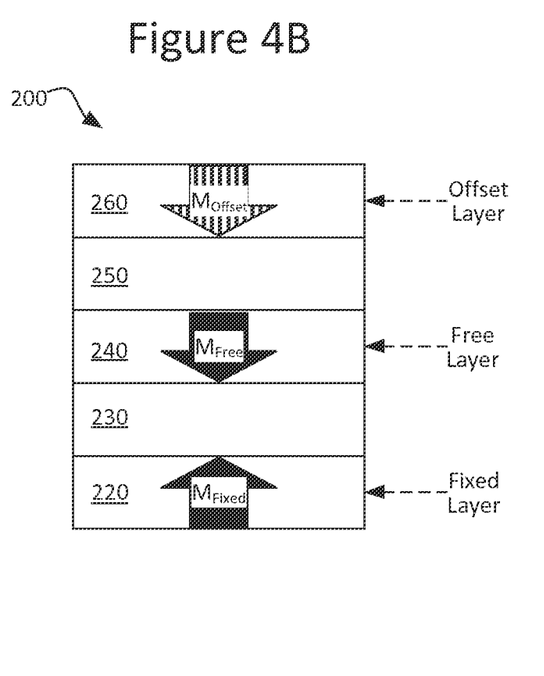
FIG. 4B is a cross-section, schematic view of the perpendicular MTJ of FIG. 4A in its anti-parallel state, configured in accordance with an embodiment of the present invention.

As can be seen from FIGS. 3A-3B and 4A-4B, a non-magnetic spacer layer 250 may be included in the structure of perpendicular MTJ 200. The non-magnetic spacer 250 may be, for example, adjacent to or otherwise integrated with the offset layer 260. As shown in FIGS. 3A-3B, the non-magnetic spacer 250 can be provided between offset layer 260 and fixed ferromagnetic layer 220. Alternatively, and as shown in FIGS. 4A-4B, the non-magnetic spacer 250 can be provided between offset layer 260 and free ferromagnetic layer 240. In some specific example embodiments, non-magnetic spacer 250 may be, for instance, the same material as insulator layer 230. In other embodiments, non-magnetic spacer 250 can be different from insulator layer 230. In one specific example embodiment, for instance, insulator layer 230 is implemented with magnesium oxide and non-magnetic spacer 250 is implemented with ruthenium or any other suitable non-magnetic material or materials. Non-magnetic spacer 250 may have one or more dimensions (e.g., surface area; thickness) comparable to those of insulator layer 230 and/or ferromagnetic layers 220, 240, and/or 260. In some specific instances, non-magnetic spacer layer 250 may have a thickness, for example, in the nanometer range (e.g., tens of angstroms), and in one specific example embodiment may be in the range of less than or equal to about 1-100 nm. In some other example embodiments, non-magnetic spacer layer 250 may have a thickness in the angstrom range (e.g., about 0.1-1 nm) and/or may be implemented as a monolayer. As similarly discussed above with reference to insulator layer 230 and/or ferromagnetic layers 220, 240, and/or 260, in some embodiments, non-magnetic spacer layer 250 may be implemented, for example, as a thin film deposited by any suitable deposition techniques (e.g., chemical vapor deposition, sputter deposition, physical vapor deposition, etc.). In still other embodiments, spacer layer 250 may be implemented with multiple layers deposited by any suitable deposition, wherein the multiple layers may be the same material or different materials (insulator materials, or a combination of insulator materials and non-insulator materials). Other suitable materials, geometries, and/or configurations for non-magnetic spacer layer 250 will be apparent in light of this disclosure, and the claimed invention is not intended to be limited to any particular material, geometry, and/or configuration.

FIG. 4A is a cross-section, schematic view of a perpendicular MTJ 200 in its parallel (P) state, configured in accordance with another embodiment of the present invention. FIG. 4B is a cross-section, schematic view of the perpendicular MTJ 200 of FIG. 4A in its anti-parallel (AP) state, configured in accordance with an embodiment of the present invention. As can be seen in this example configuration, MTJ 200 includes an insulator layer 230 sandwiched between a fixed ferromagnetic layer 220 and a free ferromagnetic layer 240. In addition, MTJ 200 includes a non-magnetic spacer 250 sandwiched between an offset layer 260 and the free ferromagnetic layer 240. The magnetization $M_{Offset}$ of the offset layer 260 may be opposite that of the fixed ferromagnetic layer 220, in accordance with an embodiment of the present invention. In both the P state (FIG. 4A) and the AP state (FIG. 4B), offset layer 260 introduces an additional internal magnetic field (via its magnetization $M_{Offset}$) which, in some embodiments, shifts (e.g., better centers) R-H hysteresis, increases the energy of the P state and/or reduces the energy of the AP state (e.g., better equalizes the energy barrier between the P and AP states), and/or otherwise improves performance of the perpendicular MTJ 200. Accordingly, the performance of perpendicular MTJ 200 may approach or otherwise approximate the idealized perpendicular MTJ performance discussed above with reference to FIGS. 2A-2B. The magnitude of $M_{Offset}$ may be chosen, adjusted, or otherwise tuned as suitable for a given application, as will be apparent in light of this disclosure. As will be appreciated, relevant portions of the previous discussion with respect to common features of FIGS. 3A-3B equally apply to those features shown in FIGS. 4A-4B.

Recall that, in some example embodiments, the additional magnetic field from offset layer 260 may affect (e.g., mitigate or eliminate) the intrinsic asymmetric energy barrier between the P and AP states of perpendicular MTJ 200. As will be appreciated, the relative proximity of ferromagnetic offset layer 260 to fixed ferromagnetic layer 220 (as shown in FIGS. 3A-3B) and/or free ferromagnetic layer 240 (as shown in FIGS. 4A-4B) may alter/tune the effect of $M_{Offset}$ on the AP/P energy barrier for perpendicular MTJ 200. Thus, and in accordance with an embodiment of the present invention, one or more dimensions (e.g., thickness) of non-magnetic spacer 250, may be modulated, thus changing/tuning the effective distance between offset layer 260 and ferromagnetic layers 220 and/or 240 of perpendicular MTJ 200. Similarly, as will be appreciated, one or more dimensions (e.g., thickness) of fixed ferromagnetic layer 220, free ferromagnetic layer 240, and/or offset layer 260 may be modulated to alter/tune the effect of $M_{Offset}$ (e.g., increasing the thickness of a given ferromagnetic layer 220, 240, and/or 260 may result in a greater effect from $M_{Offset}$). In some such cases, such dimension modulation may achieve various changes in the effect of $M_{Offset}$ and thus shift (e.g., better center) R-H hysteresis, increase the energy of the P state and/or reduce the energy of the AP state (e.g., better equalize the energy barrier between the P and AP states), and/or otherwise improve performance of the perpendicular MTJ 200.

In some embodiments in which an offset layer 260 is included in or otherwise proximate fixed ferromagnetic layer 220, one or more of the dimensions of non-magnetic spacer 250 may be chosen such that the magnetization $M_{Fixed}$ of fixed layer 220 remains substantially unaltered (e.g., constant) in the presence of the magnetic field produced by offset layer 260 (e.g., the magnetization of fixed layer 220 is not prone to flipping due to the presence of $M_{Offset}$). In some cases, fixed layer 220 may be designed, in part or in whole, such that a given thickness (or range of thicknesses) of non-magnetic spacer 250 does not destabilize its magnetization (e.g., its magnetization is not prone to flipping due to $M_{Offset}$).

In some embodiments in which an offset layer 260 is included in or otherwise proximate free ferromagnetic layer 240, one or more of the dimensions of non-magnetic spacer 250 may be chosen such that the magnetization $M_{Free}$, of free layer 240 may be altered (e.g., more readily flipped) in the presence of the magnetic field produced by offset layer 260 (e.g., the magnetization of free layer 240 is prone or otherwise permitted to flip due to the presence of $M_{Offset}$). In some cases, free layer 240 may be designed, in part or in whole, such that a given thickness (or range of thicknesses) of non-magnetic spacer 250 sufficiently (e.g., suitably for a given application) destabilizes its magnetization (e.g., its magnetization is more prone to flipping due to $M_{Offset}$).

Modulating the thickness, for example, of non-magnetic spacer 250 may allow, in some embodiments, for more easily changing the direction of the magnetization of free layer 240. As will be appreciated, adjustment/tuning of the thickness of non-magnetic spacer 250 may allow for one or more of the following types of interaction between offset layer 260 and free ferromagnetic layer 240: (1) ferromagnetic (e.g., $M_{Free}$ and $M_{Offset}$ have the same alignment and there is a net magnetic moment in the absence of an external magnetic field); (2) anti-ferromagnetic (e.g., $M_{Free}$ and $M_{Offset}$ have opposite alignments and there is zero net magnetization in the absence of an external magnetic field); and/or (3) zero coupling. In some specific example embodiments in which zero coupling is desired, the non-magnetic spacer 250 may have at least one dimension (e.g., thickness) in the range of about 1-10 Å (e.g., less than or equal to about 8 Å). Other thicknesses/dimensions of non-magnetic spacer 250 suitable for achieving zero coupling (and/or other type of interaction or desired performance) with free layer 240 will be apparent in light of this disclosure, and the claimed invention is not intended to be limited to any particular such geometry.

Any of the various layers of a given perpendicular MTJ 200 (e.g., fixed layer 220, insulator layer 230, free layer 240, spacer layer 250, and/or offset layer 260) may be formed/deposited by any suitable techniques, including, but not limited to, chemical vapor deposition, physical vapor deposition, magnetron sputter deposition, molecular beam epitaxy, etc. In some embodiments, formation/preparation of perpendicular MTJ 200 may include, in part or in whole, one or more photolithography techniques. Other suitable formation techniques will be apparent in light of this disclosure, and the claimed invention is not intended to be limited to any particular formation technique.

Figure 5:
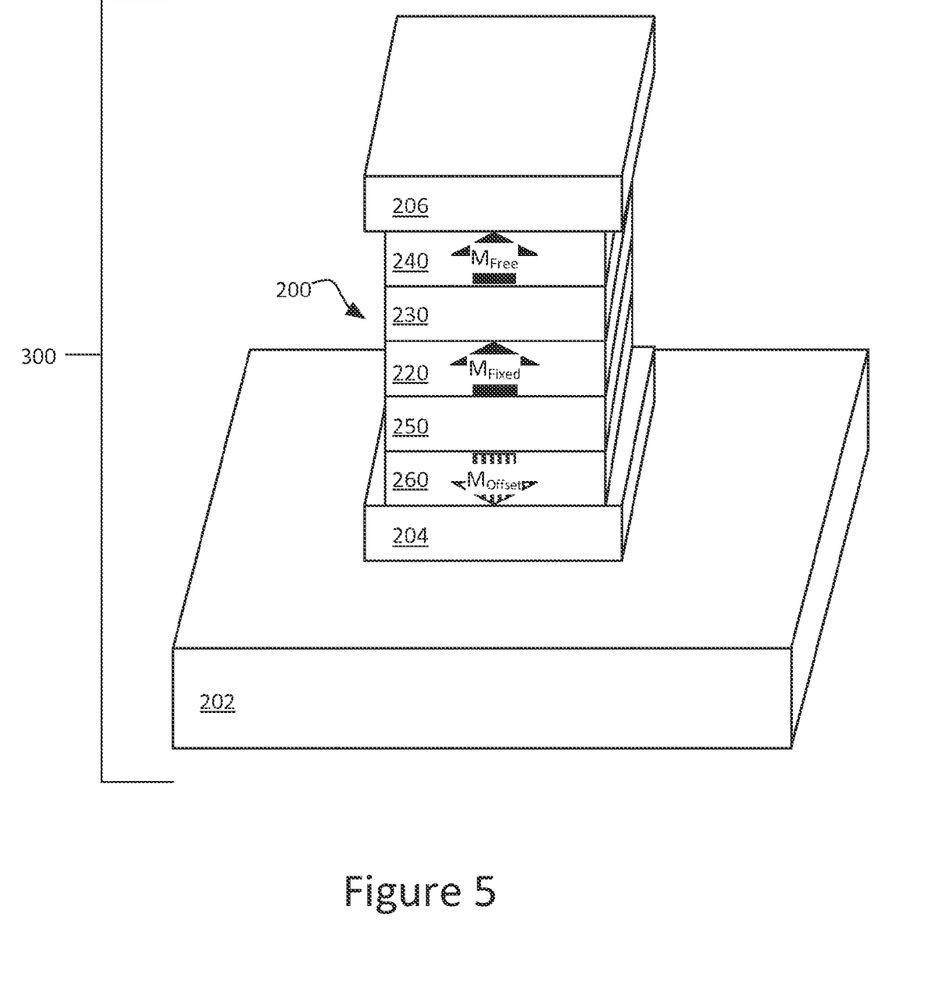
FIG. 5 is a perspective, schematic view of an example integrated circuit implementing a perpendicular MTJ configured in accordance with an embodiment of the present invention.

FIG. 5 is a perspective, schematic view of an example integrated circuit (IC) 300 implementing a perpendicular MTJ 200 configured in accordance with an embodiment of the present invention. As similarly discussed above with reference to FIG. 3A, here the example perpendicular MTJ 200 is in its P state and includes an additional ferromagnetic layer (offset layer) 260 proximate the fixed layer 220 and a non-magnetic spacer 250 therebetween. However, the claimed invention is not intended to be limited to only the depicted example; any of the various example embodiments of FIGS. 3A-3B and/or 4A-4B may be similarly implemented in an IC 300 as depicted in FIG. 5, in accordance with an embodiment.

In accordance with some example embodiments, substrate 202 may be, for example, a semiconductor wafer or other suitable substrate. In some such embodiments, the substrate 202 may be, for example, a metal, silicon, germanium, III-V materials, oxide, nitride, or combinations thereof. In some embodiments, the substrate 202 may be configured, for example, as a bulk substrate, a semiconductor-on-insulator (XOI, where X is a semiconductor material such as silicon, germanium, or germanium-enriched silicon), or a multi-layered structure. Other suitable materials and/or configurations for substrate 202 will depend on a given application and will be apparent in light of this disclosure.

As can be further seen, perpendicular MTJ 200 may be implemented with one or more electrical contacts 204 and/or 206. In some embodiments, perpendicular MTJ 200 may be operatively coupled with substrate 202 (and/or other IC structure or feature). In some such instances, perpendicular MTJ 200 may be operatively coupled with, for example, a conductive line/run, via, and/or other circuit component comprising a conductive metal such as, but not limited to, copper, aluminum, silver, nickel, gold, titanium, indium, tungsten, alloys thereof, or other suitably conductive metal.

Passage of a suitable current through perpendicular MTJ 200 may be performed, in some example embodiments, to determine whether the MTJ 200 is in its low-resistance P state (e.g., fixed ferromagnetic layer 220 and free ferromagnetic layer 240 are in the same magnetic alignment) or in its high-resistance AP state (e.g., fixed layer 220 and free layer 240 are in opposing magnetic alignment). In some such embodiments, determination of these binary states (e.g., low resistance and high resistance states) of MTJ 200 may be implemented in a memory cell/device, such as those previously discussed (e.g., MRAM, SRAM, DRAM, etc.). Other suitable uses of perpendicular MTJ 200 will depend on a given application and will be apparent in light of this disclosure.

Example System

Figure 6:
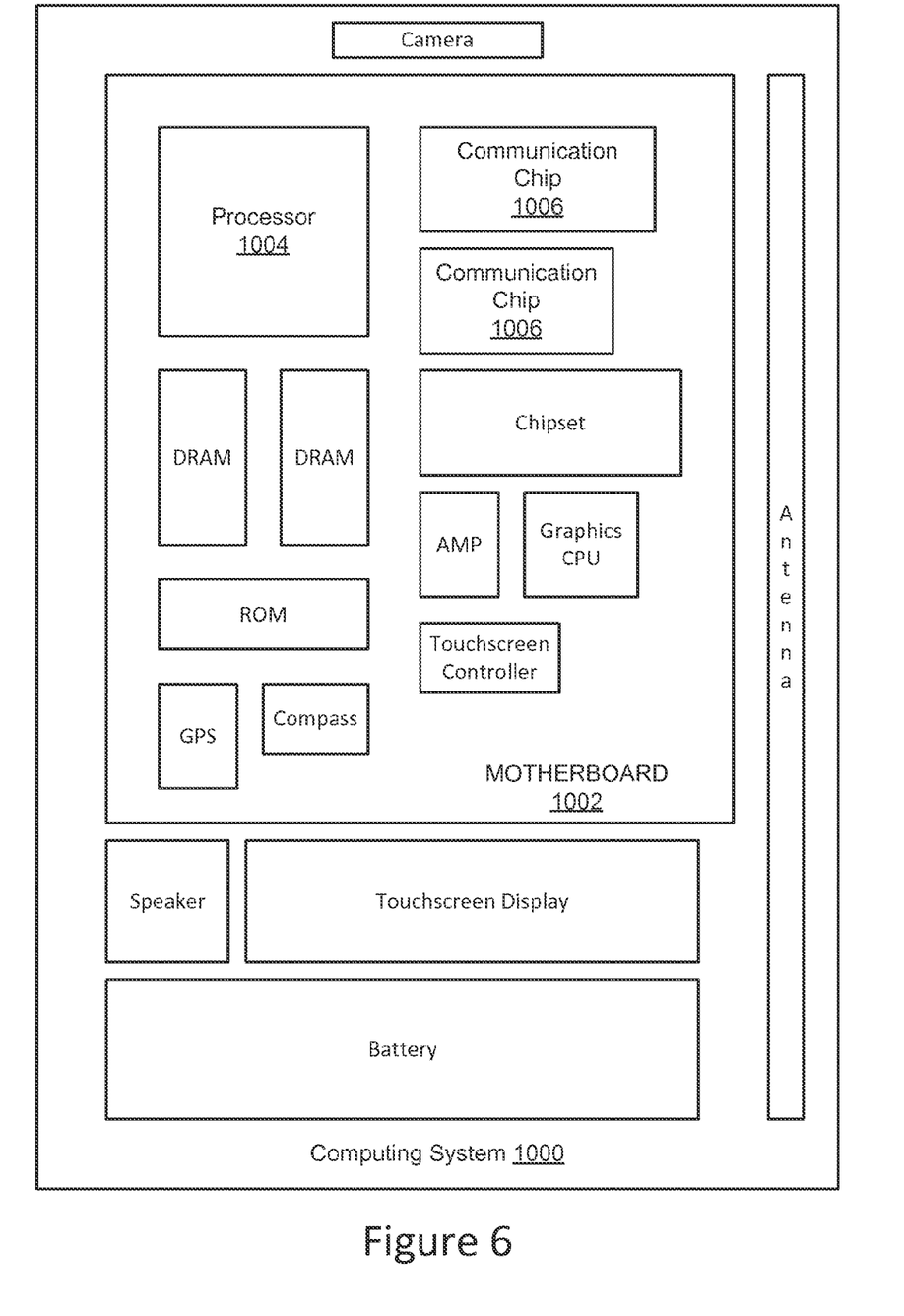
FIG. 6 illustrates a computing system implemented with integrated circuit structures or devices including one or more perpendicular MTJs configured in accordance with an example embodiment of the present invention.

FIG. 6 illustrates a computing system 1000 implemented with integrated circuit structures or devices including one or more perpendicular MTJs configured in accordance with an embodiment of the present invention. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., magnetoresistive RAM; spin transfer torque memory, STTM; ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices including one or more perpendicular MTJs configured in accordance with an embodiment of the present invention. These MTJ transistor structures variously described herein can be used, for instance, to implement an on-board processor cache or memory array (e.g., MRAM, DRAM, etc.). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard memory circuitry that is implemented with one or more integrated circuit structures or devices including one or more perpendicular MTJs, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices including one or more perpendicular MTJs as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs one or more integrated circuit structures or devices including one or more perpendicular MTJs, as described herein.

Numerous embodiments will be apparent, and features described herein can be combined in any number of configurations. One example embodiment of the present invention provides a magnetic tunnel junction device including a first insulator layer sandwiched between a free ferromagnetic layer and a fixed ferromagnetic layer and a second insulator layer sandwiched between a third ferromagnetic layer and one of the free or fixed ferromagnetic layers. In some cases, each of the free, fixed, and third ferromagnetic layers are associated with a magnetization direction, and the magnetization direction of the third ferromagnetic layer is opposite the magnetization direction of the fixed ferromagnetic layer. In some cases, the magnetization directions of the fixed and third ferromagnetic layers are not permitted to change, and the magnetization direction of the free ferromagnetic layer is permitted to change. In some cases, the magnetization directions of the fixed and free ferromagnetic layers are aligned parallel. In other cases, the magnetization directions of the fixed and free ferromagnetic layers are aligned anti-parallel. In some cases, the fixed, free, and/or third ferromagnetic layers comprise one or more of iron, cobalt, nickel, boron, and/or alloys thereof. In some cases, the first and second insulator layers comprise different materials. In some cases, the first insulator layer comprises magnesium oxide and the second insulator layer comprises ruthenium. In some cases, inclusion of the third ferromagnetic layer in the magnetic tunnel junction device at least one of mitigates the intrinsic offset in energy barrier between parallel and anti-parallel states of the magnetic tunnel junction device, centers resistance-external magnetic field hysteresis of the magnetic tunnel junction device, allows for efficient and/or expedient switching between parallel and anti-parallel states of the magnetic tunnel junction device, and/or maintains simple device patterning. In some cases, the device is implemented in at least one of embedded memory, non-volatile memory, magnetoresistive random-access memory, spin transfer torque memory, volatile memory, static random-access memory, and/or dynamic random-access memory. In some cases, an integrated circuit is provided and includes one or more such magnetic tunnel junction device.

Another example embodiment of the present invention provides an integrated circuit including a substrate and a magnetic tunnel junction formed in or on the substrate, wherein the magnetic tunnel junction includes a first insulator layer sandwiched between a free ferromagnetic layer and a fixed ferromagnetic layer, wherein each of the free and fixed ferromagnetic layers are associated with a magnetization direction, and a second insulator layer sandwiched between a third ferromagnetic layer and one of the free or fixed ferromagnetic layers, wherein the third ferromagnetic layer is associated with a magnetization direction that is opposite the magnetization direction of the fixed ferromagnetic layer. In some cases, the circuit further includes one or more electrical contacts operatively coupled with the magnetic tunnel junction, wherein a parallel or anti-parallel state of the magnetic tunnel junction is determined by passing a current therethrough. In some cases, the first insulator layer comprises magnesium oxide and the second insulator layer comprises ruthenium. In some cases, the circuit is implemented in at least one of embedded memory, non-volatile memory, magnetoresistive random-access memory, spin transfer torque memory, volatile memory, static random-access memory, and/or dynamic random-access memory. In some cases, an electronic device is provided and includes one or more such integrated circuit. In some such cases, the device includes at least one of a memory circuit, a communication chip, a processor, and/or a computing system. In some cases, a computing system is provided and includes one or more such integrated circuit.

Another example embodiment of the present invention provides a method including providing a first insulator layer sandwiched between a free ferromagnetic layer and a fixed ferromagnetic layer and providing a second insulator layer sandwiched between a third ferromagnetic layer and one of the free or fixed ferromagnetic layers. In some cases, the method further includes providing one or more electrical contacts operatively coupled with one or more of the ferromagnetic layers.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A magnetic tunnel junction device comprising:
   a first insulator layer sandwiched between a free ferromagnetic layer and a fixed ferromagnetic layer; and
   a second insulator layer sandwiched between a third ferromagnetic layer and one of the free or fixed ferromagnetic layers.

2. The device of claim 1, wherein each of the free, fixed, and third ferromagnetic layers are associated with a magnetization direction, and the magnetization direction of the third ferromagnetic layer is opposite the magnetization direction of the fixed ferromagnetic layer.

3. The device of claim 2, wherein the magnetization directions of the fixed and third ferromagnetic layers are not permitted to change, and the magnetization direction of the free ferromagnetic layer is permitted to change.

4. The device of claim 2, wherein the magnetization directions of the fixed and free ferromagnetic layers are aligned parallel.

5. The device of claim 2, wherein the magnetization directions of the fixed and free ferromagnetic layers are aligned anti-parallel.

6. The device of claim 1, wherein at least one of the fixed, free, and third ferromagnetic layers comprise one or more of iron, cobalt, nickel, boron, and alloys thereof.

7. The device of claim 1, wherein the first and second insulator layers comprise different materials.

8. The device of claim 1, wherein the first insulator layer comprises magnesium oxide and the second insulator layer comprises ruthenium.

9. The device of claim 1, wherein inclusion of the third ferromagnetic layer in the magnetic tunnel junction device at least one of: mitigates the intrinsic offset in energy barrier between parallel and anti-parallel states of the magnetic tunnel junction device; centers resistance-external magnetic field hysteresis of the magnetic tunnel junction device; allows for at least one of efficient and expedient switching between parallel and anti-parallel states of the magnetic tunnel junction device; and maintains simple device patterning.

10. The device of claim 1, wherein the device is implemented in at least one of embedded memory, non-volatile memory, magnetoresistive random-access memory, spin transfer torque memory, volatile memory, static random-access memory, and dynamic random-access memory.

11. An integrated circuit comprising one or more of the magnetic tunnel junction device of claim 1.

* * * * *